United States Patent [19]
Goldstein et al.

[11] Patent Number: 5,916,822
[45] Date of Patent: *Jun. 29, 1999

[54] METHOD OF ETCHING A SUBSTRATE BY MEANS OF CHEMICAL BEAMS

[75] Inventors: Léon Goldstein, Chaville; Jean-Louis Gentner, Gif sur Yvette; Philippe Jarry, Sucy en Brie, all of France

[73] Assignee: Alcatel Optronics, Paris, France

[*] Notice: This patent issued on a continued prosecution application filed under 37 CFR 1.53(d), and is subject to the twenty year patent term provisions of 35 U.S.C. 154(a)(2).

[21] Appl. No.: 08/694,112

[22] Filed: Aug. 8, 1996

[30] Foreign Application Priority Data

Aug. 10, 1995 [FR] France ................................. 95 09728

[51] Int. Cl.$^6$ ................................................ H01L 21/18
[52] U.S. Cl. ........................... 438/735; 438/39; 438/504; 438/694; 438/913; 438/944; 117/97; 117/103; 156/643
[58] Field of Search ............................... 156/643; 117/97, 117/103; 438/39, 504, 735, 913, 944, 694

[56] References Cited

U.S. PATENT DOCUMENTS

| | | | |
|---|---|---|---|
| 4,339,300 | 7/1982 | Noble | 204/192.3 |
| 5,047,365 | 9/1991 | Kawanaka et al. | 438/315 |
| 5,346,581 | 9/1994 | Tsang | 117/97 |
| 5,350,480 | 9/1994 | Gray | 156/345 |
| 5,362,683 | 11/1994 | Takenaka et al. | 117/54 |
| 5,490,912 | 2/1996 | Warner et al. | 204/298.02 |

FOREIGN PATENT DOCUMENTS

0261847 A3  3/1988  European Pat. Off. .
1-107531  4/1989  Japan .

OTHER PUBLICATIONS

Tsang et al, In–situ Dry Etching of InP Using Phosphorous Tri–Chloride and Re–Growth inside a Chemical Beam Epitaxial Growth Chamber, Mat. Res. Soc. Symp. Proc., vol. 300 (1993).

Saito et al, "GaAs Surface Cleaning with HC1 Gas and Hydrogen Mixture for Molecular–Beam Epitaxial Growth", *Japanese Journal of Applied Physics*, vol. 27, No. 4(2), Apr. 1988, Tokyo, Japan, pp. 1702–1703.

*Patent Abstracts of Japan*, vol. 7, No. 195 9C–183) [1340], Aug.25, 1983 corresponding to JP–A–58 095694 dated Jun. 07, 1993.

Takamori et al, Cleaning of MBE GaAs Substrates . . . , *Japanese Journal of Applied Physics*, vol. 26, No. 2; Feb. 1987, Tokyo, Japan, pp. L142–L144.

Choquette et al, "Hydrogen Plasma Processing ofGaAs and AlGaAs . . ."*Journal of Vacuum Science and Technology, Part B*, vol. 11, No. 6, Nov. 1993, New York, US pp. 2025–2032s.

*Primary Examiner*—Ceila Chang
*Attorney, Agent, or Firm*—Sughrue, Mion, Zinn, Macpeak & Seas, PLLC

[57] ABSTRACT

In order to facilitate resuming molecular beam epitaxy after etching a substrate or an epitaxial layer, the etching method is implemented in an ultra-high vacuum, and it consists in producing at least two simultaneous chemical beams converging towards the substrate or the layer, the beams being formed of substances, each of which is capable of reacting with elements of different types in the substrate or the layer so as to form volatile compounds. Application in particular to manufacturing photonic and optoelectronic components.

5 Claims, 2 Drawing Sheets

METHOD OF ETCHING A SUBSTRATE BY MEANS OF CHEMICAL BEAMS

The invention relates to the field of manufacturing integrated components, and in particular to manufacturing semiconductor components used in optoelectronics.

BACKGROUND OF THE INVENTION

In the field of photonic or optoelectronic integrated components, it is becoming necessary to form an increasingly large number of layers having different compositions or doping types on a substrate. Manufacturing such components thus generally requires numerous successive epitaxial growth operations and etching operations.

The molecular beam epitaxy method is well suited in particular to growing large numbers of very thin layers. In this technique, the layers are grown in a very high vacuum, generally lying in the range $10^{-2}$ Pa to $10^{-10}$ Pa, and referred to as an "ultra-high vacuum", in which the elements constituting the layer to be deposited, optionally accompanied by doping impurities, are simultaneously evaporated. Currently, the etching operations are performed outside the epitaxy chamber. Once the substrate has been removed from the chamber, a tried and tested etching method is applied to it such as liquid-phase chemical etching, or "dry etching": reactive ion etching or reactive ion beam etching. However, liquid-phase chemical etching suffers from the drawback of not being uniform, and therefore not being suitable for manufacturing wafers having large surface areas. Dry etching makes it possible to etch semiconductor components with good control of etching depth, and good uniformness on large substrates. However, it suffers from a certain number of limitations:

on the etched surface, a residual layer remains that has been rendered amorphous, and that has a thickness lying in the range 10 nanometers to 100 nanometers;

it is necessary to remove the amorphous layer by means of "wet" chemistry;

it is necessary to remove the polymerization products formed during etching; and it is necessary to bring the etched chips back out into the air before epitaxy is resumed.

It is therefore desirable to be able to perform etching operations in the reactor serving to perform molecular beam epitaxy, while remaining under ultra-high vacuum conditions, so as to prevent any impurities from being deposited, which would require an additional preparation step to be performed.

For substrates made of III–V type semiconductor alloys such as Inp and GaAs, ultra-high vacuum etching trials have been performed by means of chemical beams of phosphorus trichloride $PCl_3$ or of arsenic trichloride $AsCl_3$, while raising the temperature of the substrate to in the range 500° C. to 540° C. Etching is obtained by the III–V compound chemically reacting with the trichloride to form reaction products that are volatile at that temperature. Unfortunately, that ultra-high vacuum chemical approach does not make it possible to remove certain dopants or impurities such as silicon, carbon, oxygen or sulfur, which do not react with the chlorine compounds. The progressive accumulation of such dopants or impurities on the surface during the etching interferes with said etching and gives rise to a high degree of roughness on the etched surface that is incompatible with good epitaxy resumption quality.

It should be noted that the problem mentioned above in a specific context arises more generally whenever a substrate or epitaxial layers having complex compositions are to be etched by means of molecular beams. In contrast, this problem is less noticeable with the liquid-phase chemical etching method because of the rinsing effect produced by that method on the surface of the substrate. Similarly, ion beam etching produces a mechanical ion-bombardment effect which makes it possible to remove the impurities that do not react chemically.

A possible solution for solving the above problem consists in performing a surface preparation step, prior to epitaxy, by means of an agent chosen so as to react with the impurities while producing volatile compounds. But such an agent must not react with the other elements in the substrate. In order to remove metalloid-type impurities such as silicon, carbon, oxygen, or sulfur, a beam could be used composed of a reducing substance such as atomic hydrogen. However, that solution is not satisfactory because the reducing substance generally reacts with other elements in the substrate that are not to be removed. When the substrate is made of a III–V semiconductor alloy such as InP, atomic hydrogen reacts with phosphorus if the temperature of the substrate is greater than 300° C. Unfortunately, when the substrate is made of the InP alloy, the epitaxy operations and the $PCl_3$ etching operations must be performed at a substrate temperature in the vicinity of 500° C. The above-considered preparation therefore makes it difficult to chain between etching and resuming epitaxy.

OBJECTS AND SUMMARY OF THE INVENTION

An object of the invention is to improve currently used etching methods so as to simplify the technological operations required to achieve etching and re-growth sequences, thereby saving time when manufacturing industrial products.

To this end, the invention provides a method of etching a substrate or an epitaxial layer deposited on a substrate, the substrate or layer being composed of at least two substrate elements, each of which is capable of reacting with at least two added substances of different types so as to form volatile compounds of different types, said method consisting in the following steps:

producing at least two simultaneous chemical beams in an ultra-high vacuum, said beams converging towards said substrate or said epitaxial layer, and being constituted respectively by at least said two added substances; and maintaining said layer at a temperature that is high enough to evaporate the products resulting from the reactions between said substrate elements and the substances in said chemical beams.

The effectiveness of the method can be explained by the specific conditions of the ultra-high vacuum. By definition, an ultra-high vacuum is a vacuum that is sufficient for the mean free path of the molecules or atoms making up each beam to be approximately equal to the distance between the source of the beam and the surface of the substrate. In this way, regardless of their compositions, simultaneous beams have a very low probability of reacting with one another before they reach the surface of the substrate. In addition, at substrate level, the probability of the components of each beam reacting with the elements of the substrate is much higher than the probability of the components of the beams reacting with one another.

Naturally, the added substances are chosen as a function of the composition of the layer to be etched: the composition of the substrate or of the epitaxial layer, and the type of impurities intentionally or unintentionally contained therein. This choice also takes into account the possibilities of the reaction products evaporating.

It is thus particularly advantageous to choose at least two added substances capable of acting respectively on metalloid elements and on metallic elements. Such a combination generally makes it possible to obtain full etching regardless of the composition of the layer to be etched.

The method of the invention may in particular be applied to manufacturing photonic or optoelectronic components using III and V type semiconductor alloys in which the impurities are generally of metalloid type, such as carbon, sulfur, or oxygen. In which case, one of the chemical beams is advantageously a hydrogen atom beam, the other beam being a halide beam. One particular method of the present invention is a method in which the substrate is a type III–V semiconductor alloy and contains metalloid type impurities, with one of the chemical beams being a hydrogen atom beam. In a particular embodiment of this method, the alloy can contain phosphorus or arsenic, and a beam containing phosphorus or arsenic trichloride is used beside the hydrogen atom beam.

BRIEF DESCRIPTION OF THE DRAWINGS

A detailed example of application and of implementation of the method according to the invention is given in the following description with reference to the drawings, in which.

MORE DETAILED DESCRIPTION

The etching method of the invention was implemented in particular for compounds of the elements Ga, In, As, and P on an InP substrate, which compounds are commonly used for manufacturing photonic and optoelectronic components. Etching was performed by means of a phosphorus trichloride $PCl_3$ molecular beam and of an atomic hydrogen beam. The two beams were directed towards the substrate heated to a high temperature (in the range 400° C. to 600° C.).

The trichloride reacted with the metallic-type elements, i.e. indium and gallium for the substrate, and the metallic impurities such as beryllium, zinc, or iron which are often used as dopants.

The atomic hydrogen flow reacted with the metalloids to form volatile components with carbon ($CH_4$, $CH_3$, . . .), sulfur ($H_2S$), oxygen ($H_2O$), and other metalloid compounds which had not been removed by the trichloride.

It should be noted that the two flows act in complementary manner but they do not etch the dielectric masks commonly used, such as those made of silicon oxide or nitride. It is therefore possible to perform the etching locally.

Figure 1:
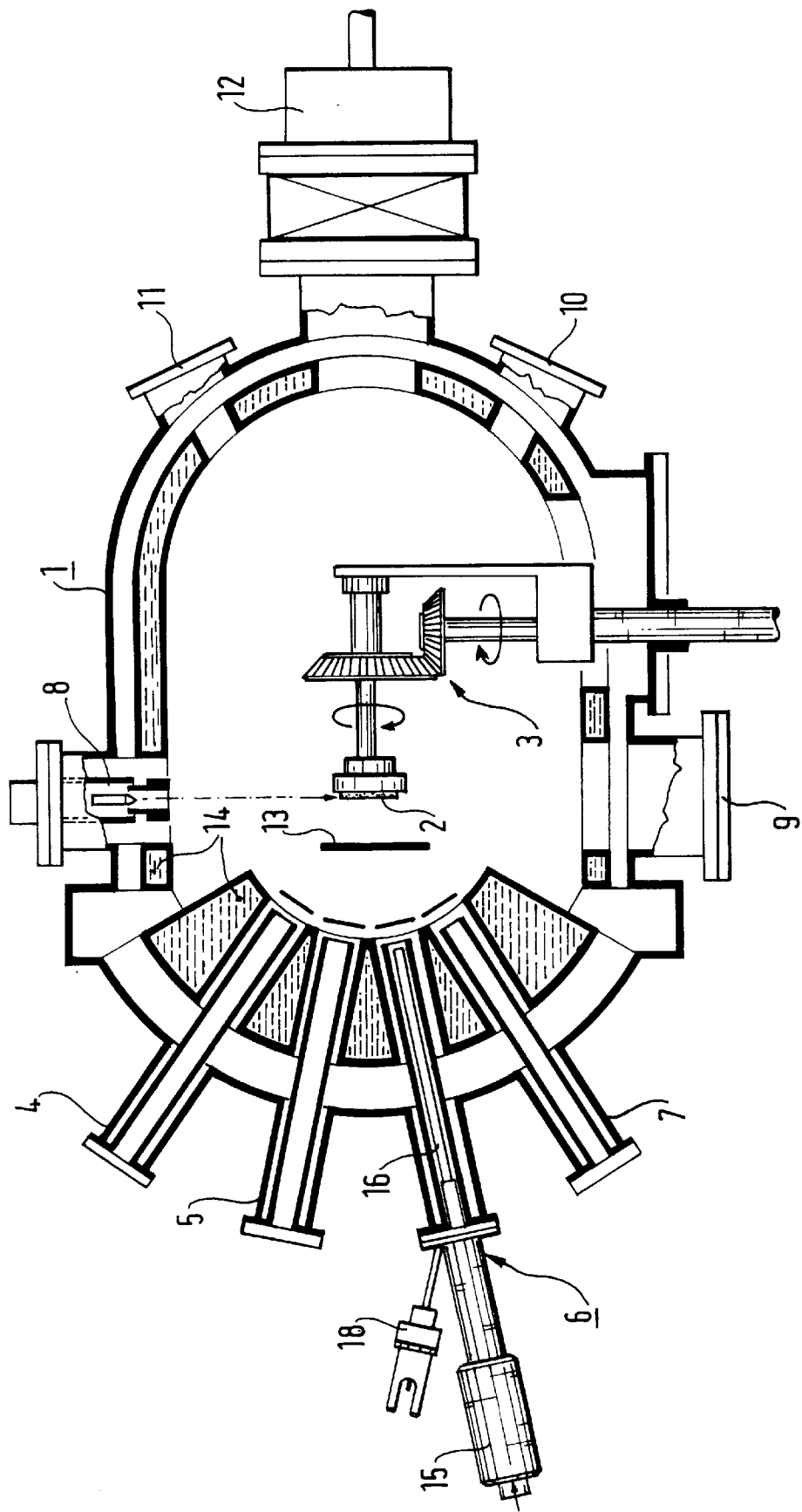
FIG. 1 shows a molecular beam epitaxy reactor.
Figure 2:
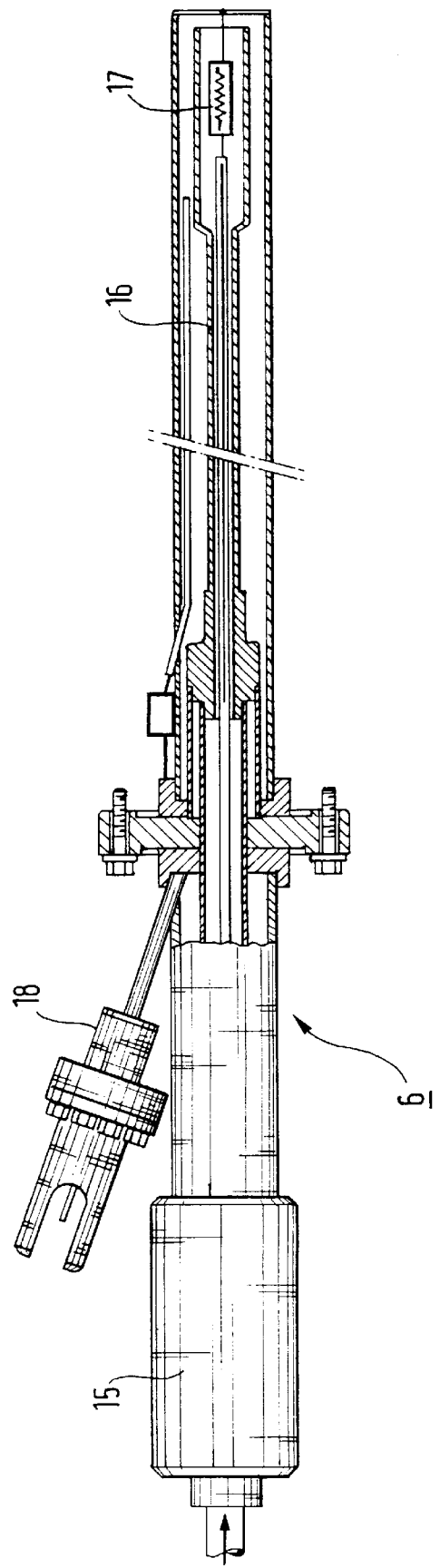
FIG. 2 shows an atomic hydrogen generating unit used in the reactor shown in FIG. 1.

The method of the invention may be implemented by means of an installation normally organized for molecular beam epitaxy. FIG. 1 is a diagrammatic plan view showing the main parts of such an installation. It is composed of an epitaxy chamber 1 organized to withstand a very high vacuum. A substrate manipulator 3 carrying the substrate 2 under treatment and equipped with heating means is disposed inside the chamber. In operation, the manipulator 3 is angularly positioned so as to place the surface of the substrate facing effusion units 4, 5, 6, 7 associated with individual retractable screens. Each unit normally includes an evaporation crucible equipped with an oven in which the substance to be deposited on the surface of the substrate is placed. For the purposes of implementing the invention, one of the units 6 is a hydrogen atom source 6 which is described in more detail with reference to FIG. 2.

Conventionally, the reactor also includes a main retractable screen 13 and an electron gun 8 associated with a fluorescent screen 9 serving to monitor the surface state of the substrate by the glancing incidence electron diffraction method. Nitrogen tanks 14 are also provided so as to cool the inside of the enclosure. Observation windows 10, 11 make it possible to perform visual surveillance of the inside of the chamber. An air-lock valve 12 makes it possible to insert and remove the substrate carried by the manipulator 3.

The units 4, 5, and 7 may be of conventional design, one of them serving to contain, for example, the substance capable of reacting on the metallic elements of the substrate. Advantageously, in order to remove the metalloid elements, an atomic hydrogen beam is used supplied by a specific unit such as the unit described with reference to FIG. 2.

The unit is essentially composed of a molecular hydrogen feed tube connected at one end to an end-piece 15 and contained in a protective tube. The other end of the feed tube 16 contains a heating filament powered via the end-piece. Optionally, the unit includes a thermocouple 18 serving to measure the temperature at the output of the tube 16. To obtain a beam of hydrogen atoms, the temperature must be maintained at over 1,500° C.

The above example is in no way to be considered as limiting.

The invention is applicable to substrates of various compositions such as gallium arsenide or ternary or quaternary compounds. An equivalent of the atomic hydrogen beam could be a molecular beam of a substance giving off atomic hydrogen on contact with the substrate. An example of a substance having this property is tridimethylamino-arsine $(As[N(CH_3)_2]_3$.

We claim:

1. A method of etching a substrate or an epitaxial layer deposited on a substrate, the substrate or layer comprising at least two substrate elements, each of which is capable of reacting with at least two added substances of different types so as to form volatile compounds of different types, said method comprising:

producing at least two simultaneous chemical beams in an ultra-high vacuum, said beams converging towards said substrate or said epitaxial layer, and respectively comprising at least said two added substances; and maintaining said substrate and/or layer at a temperature that is high enough to evaporate the products resulting from the reactions between said substrate elements and the substances in said chemical beams, wherein at least one of said added substances is capable of acting on metalloid elements, and at least one other of said added substances is capable of acting on metallic elements, wherein said substrate is a type III–V semiconductor alloy, and contains metalloid-type impurities or dopants selected from the group consisting of C, O, Si and S, and wherein at least one of said beams reacts with metallic-type elements of the substrate but not with said metalloid-type impurities or dopants, and at least one other of said beams reacts with said metalloid-type impurities or dopants.

2. A method according to claim 1, wherein one of said chemical beams is a hydrogen atom beam.

3. A method according to claim 1, wherein one of said chemical beams is a halide beam.

4. A method according to claim 2, wherein said alloy contains phosphorus or arsenic, and the other beam contains respectively phosphorus or arsenic trichloride.

5. A method according to claim 4, wherein the temperature of the substrate lies in the range 400 degrees Celsius to 600 degrees Celsius.

* * * * *